United States Patent [19]

Takatsu

[11] Patent Number: 5,284,725
[45] Date of Patent: Feb. 8, 1994

[54] PHOTO-MASK FOR MANUFACTURE OF TWO-LAYER TAB

[75] Inventor: Akio Takatsu, Ichikawashi, Japan

[73] Assignee: Sumitomo Metal Mining Co., Ltd., Tokyo, Japan

[21] Appl. No.: 791,179

[22] Filed: Nov. 13, 1991

[30] Foreign Application Priority Data

Nov. 16, 1990 [JP] Japan ................................. 2-311132

[51] Int. Cl.$^5$ ............................................. G03F 9/00
[52] U.S. Cl. ........................................ 430/5; 430/312; 430/313; 430/314; 430/315; 430/317; 430/318; 428/137; 29/827; 437/220; 156/902
[58] Field of Search ................... 430/5, 312, 313, 314, 430/315, 317, 318; 428/137; 29/827; 437/220; 156/902

[56] References Cited

U.S. PATENT DOCUMENTS 4,944,850 7/1990 Dion ........................................ 29/827

Primary Examiner—Marion E. McCamish
Assistant Examiner—Mark A. Chapman
Attorney, Agent, or Firm—Watson, Cole, Grindle & Watson

[57] ABSTRACT

Disclosed are photo-masks for use in two exposure steps to be effected for forming a ground metal layer on the back surface of a substrate in manufacture of a two-layer TAB in which a metal layer is formed on one surface or both surfaces of an insulating resin substrate without an adhesive, determined metal leads are formed on the top surface of the substrate, via holes are formed on the determined positions of the substrate, a ground metal layer is formed on the back surface of the substrate, and a part of the leads as formed on the top surface of the substrate are electrically connected with the ground metal layer as formed on the back surface of the same via the via holes; the photo-masks being characterized in that the photo-mask to be used in the first exposure step for forming the via holes to the back surface of the substrate is provided with alignment marks in the determined plural positions thereof and that the photo-mask to be used in the second exposure step for forming the ground metal layer on the back surface of the substrate is provided with alignment marks in the positions corresponding to the positions of the alignment marks made in the first photomask.

2 Claims, 6 Drawing Sheets

PHOTO-MASK FOR MANUFACTURE OF TWO-LAYER TAB

FIELD OF THE INVENTION

The present invention relates to a photo-mask for exposure and development, and which is used in manufacture of a two-layered TAB for electronic parts. More precisely, it relates to a photo-mask to be used in the manufacture of a two-layer TAB in which determined metal leads are formed on the top surface of a substrate, a ground metal layer is formed on the back surface of the substrate and a part of the leads are electrically connected to the ground metal layer via via holes formed through the substrate, the photomask being used in the exposure and development step applied to the back surface of the substrate as a part of the process of forming the via holes and the ground metal layer.

BACKGROUND OF THE INVENTION

Recently, development of multi-functional devices which are low-priced but have a high reliability has noticeably progressed in electronics industries. Accordingly, high-function and high-density devices and elements have been realized and a demand for light-weighed, thin-formed and small-sized devices having a high reliability and a multi-function is increasing. As such, development of a novel and improved technique for fitting such devices and elements in electronics apparatus has become increasingly important. In particular, development of small-sized and diversified IC package parts is an especially important theme in this technical field. With progress of the technique of fitting electronic devices and elements, formation of fine pin pitches capable of satisfying the demand for multi-pin structure in small-sized IC packages is desired.

TAB is one having a plurality of bonding fine metal lead patterns as formed on an electrically insulating tape-shaped synthetic resin film substrate such as polyimide tape substrate. Since TAB has test pads, it is possible to find out any bonding failure or chip disorder after bonding of chips but before fitting of substrate to TAB. Additionally, the size of the IC pad to be applied may be much small-sized as compared with wire bonding and therefore formation of a more multi-pined structure is possible. That is, TAB is characterized by the noted advantages.

TAB is classified into three kinds: one-layer TAB, two-layer TAB and three-layer TAB. One-layer TAB is composed of only a patterned metal tape such as a patterned copper foil tape. Such a one-layer TAB has a poor mechanical strength since the thickness of the metal layer itself is at most about several ten microns. Additionally, the number of pins to be applied to the one-layer TAB is limitative. Therefore, the one-layer. TAB is not suitable for large-scaled IC or the like devices. In order to overcome the drawback of the one-layer TAB, a three-layer TAB has been developed in which a metal foil is laminated on a synthetic resin film via an adhesive and the metal foil is patterned. However, the three-layer TAB has a drawback that insulation between pins could not sufficiently be ensured even through a highly insulating synthetic resin film such as a polyimide resin film is used as a substrate, because of the influence of the adhesive to be used as the interlayer.

Two-layer TAB is manufactured by directly forming a metal layer on the surface of an insulating synthetic resin film substrate by sputtering, vapour deposition, plating or the like metal-coating method without using an adhesive followed by patterning the thus-formed metal layer. As the two-layer TAB does not use any adhesive in forming the metal layer on the surface of the substrate, it is free from problems of electric insulation and can be used stably. Therefore, the use of the two-layered TAB is considered hopeful.

Formation of leads on the surface of the two-layer TAB can be effected by an additive method in which a photo-resist is coated on a subbing metal layer as coated on the surface of an insulating synthetic resin substrate such as a polyimide resin substrate by dry surface-treatment such as sputtering or vacuum evaporation coating or by wet surface-treatment such as chemical plating, as mentioned above, the thickness of the photo-resist being larger than the thickness of the leads to be formed, then a specifically defined resist is formed by exposure and development, and thereafter leads are finally formed by electric plating. The leads can also be formed by a subtractive method in which a metal layer is previously formed on the above-mentioned subbing metal layer in the same thickness as leads, then a resist pattern is formed on the layer, and thereafter the intended leads are finally formed by etching.

For continuously bonding such two-layer TAB's to IC chips, it is necessary to form holes for conveying the tape (hereinafter referred to as a "sprocket hole"), holes for exposing the top of the lead so that the exposed lead is bonded to an IC chip (hereinafter referred to as a "device hole"), holes for connecting the bottom of the lead to an external circuit (hereinafter referred to as an "OLB" hole), and further holes for inserting a guide pin thereinto in order that the top of the lead may accurately be bonded to an IC chip (hereinafter referred to as a "tooling hole), these holes being provided through the insulating chemical resin substrate by chemical dissolution.

For dissolution of the insulating resin, there may be employed a wet method of dissolving the resin with an insulating resin-dissolving liquid as well as an optical method of using laser rays.

It has already been confirmed that such two-layer TAB's manufactured by combination of the above-mentioned various methods have a high-level potency as mentioned above. However, because of further elevation of the fitting density of electronic parts and further elevation of the performance speed of electronic apparatus, development of further high-leveled two-layer TAB's having a function of preventing errors by cross talk and a function of impedance matching is desired. As one example of two-layer TAB's provided with such functions, there has been proposed a two-layer TAB in which a ground metal layer is formed on the opposite surface to the surface having leads thereon and via holes are holed through a resin substrate so that a part of the leads are electrically connected with the ground metal layer via the via holes.

A method of preparing the proposed two-layer TAB will be briefly mentioned below. First, a metal layer such as a copper layer is formed on both surfaces or one surface of an insulating resin substrate such as a polyimide substrate without using an adhesive. For forming the metal layer, conventional methods which include a dry metal layer-forming method such as a sputtering method and a wet metal layer-forming method such as a chemical plating method are used. Next, a photo-resist layer is formed on the both surfaces of the substrate; a photo-mask having a pattern corresponding to the determined leads is applied to the top surface of the substrate while a photo-mask corresponding to the determined via holes is applied to the back surface of the same; and thus the substrate is exposed and developed so as to form the determined resist patterns on the both surfaces.

Formation of the leads may be effected, using either the above-mentioned additive method or the above-mentioned additive method in accordance with the thickness of the metal layer as previously formed on the back surface of the substrate. Formation of the via holes may be effected by dissolving and removing the exposed parts of the insulating resin as exposed in accordance with the resist pattern on the back surface of the substrate, using a dissolving liquid, when the metal layer has previously been formed on only one surface of the substrate. On the other hand, where the metal layer has previously been formed on both surfaces of the substrate, formation of the via holes may be effected in such a way that a metal layer pattern in which only the parts corresponding to the intended via holes are exposed is formed on the back surface of the substrate by resist pattern treatment, and thereafter the parts where the insulating resin is exposed are dissolved in the same manner as mentioned above to form the intended via holes.

Next, a thin metal layer is formed on all the back surface of the substrate including the side surfaces of the formed via holes by a dry or wet metal layer-forming method, and thereafter a resist layer is formed on the thin metal layer either immediately or after lamination of a metal plate layer on the thin metal layer by electric plating or the like. Then, a photo-mask having a desired hole pattern, including device holes, OLB holes, sprocket holes, and tooling holes is applied to the back surface of the substrate as coated with the resist layer, and the substrate is thereafter exposed and developed to form the desired resist pattern.

Where the resist layer has been formed immediately after formation of the thin metal layer on the back surface of the substrate, the above-mentioned additive method may be employed to form a ground metal layer having the desired pattern. On the other hand, where the resist layer has been formed after lamination of the metal plate layer over the thin metal layer formed on the back surface of the substrate, the above-mentioned subtractive method may be employed to form the same.

The above-mentioned process of forming the two-layer TAB having the above-mentioned construction has two exposure steps. In the second exposure step, in particular, it is necessary to effect accurate alignment between the resist layer as formed on the back surface of the substrate and the photo-mask to be applied to the resist layer. However, provision of alignment marks for attaining accurate alignment between the positions of the formed via holes and the relative positions of other various holes in the photo-mask is generally unknown.

Under the situation, development of a method for attaining accurate alignment between the positions of the via holes as formed on the back surface of a substrate and the relative positions of other various holes to be formed after formation of the via holes is desired. The object of the present invention is to provide photomasks capable of easily effecting such accurate alignment in manufacture of a two-layer TAB.

SUMMARY OF THE INVENTION

In order to attain the object, there are provided in accordance with the present invention photo-masks for forming a back surface structure of a substrate in manufacture of a two-layer TAB in which a metal layer is formed on one surface or both surfaces of an insulating resin substrate without an adhesive, determined metal leads are formed on the top surface of the substrate, via holes are formed on the determined positions of the substrate, a ground metal layer is formed on the back surface of the substrate, and a part of the leads as formed on the top surface of the substrate are electrically connected with the ground metal layer as formed on the back surface of the same via the via holes; the photomasks being characterized in that the photo-mask to be used in the first exposure step for forming the via holes to the back surface of the substrate is provided with alignment marks in the determined plural positions thereof and that the photo-mask to be used in the second exposure step for forming the ground metal layer on the back surface of the substrate is provided with alignment marks in the positions corresponding to the positions of the alignment marks made in the first photo-mask.

DETAILED DESCRIPTION OF THE INVENTION

The details of photo-masks for manufacture of a two-layer TAB of the present invention will be explained hereunder with reference to the drawings attached hereto, along with the effects of them.

Figure 1:
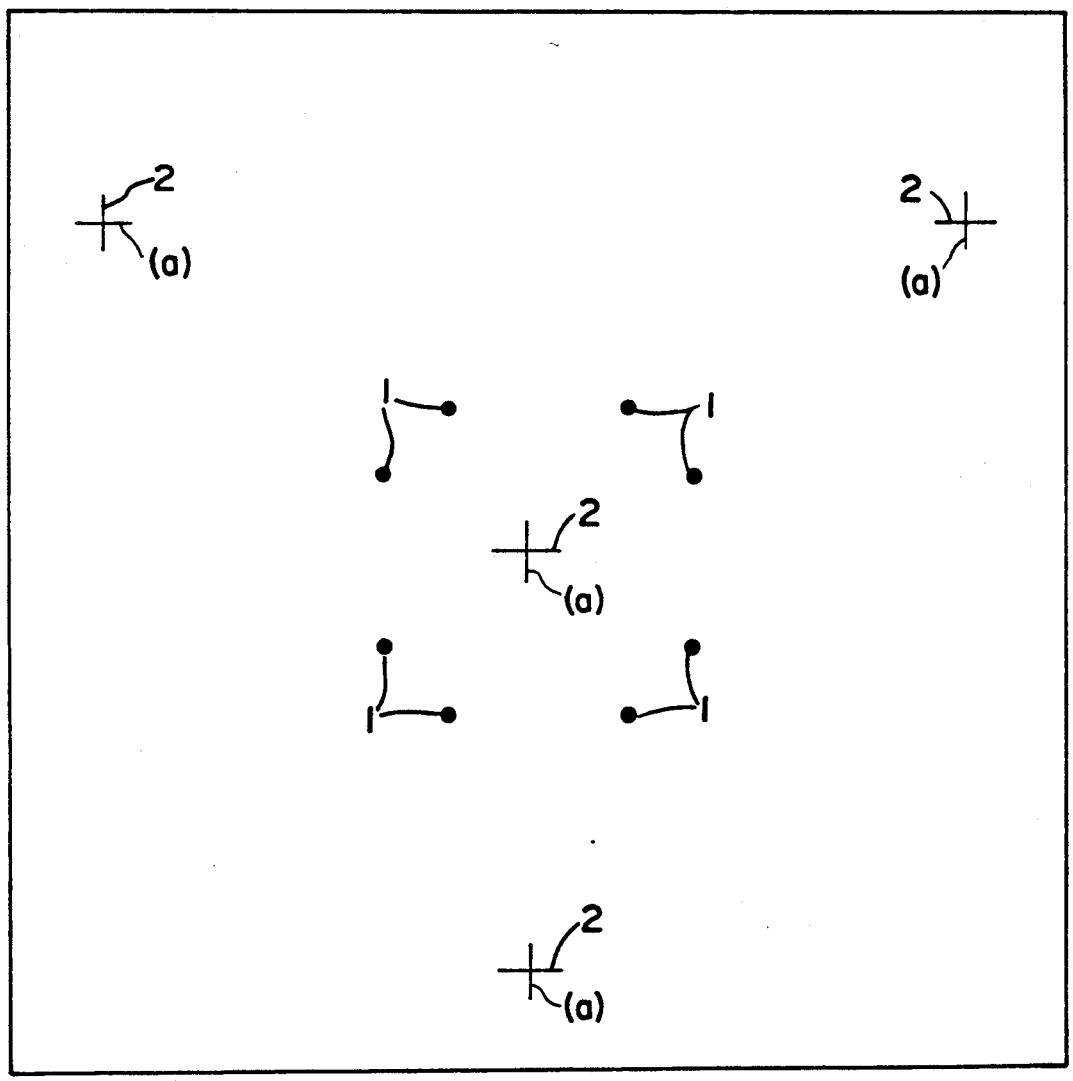
FIG. 1 shows one embodiment of a photo-mask of the present invention for forming via holes to the back surface of a substrate (hereinafter referred to as photo-mask A).

FIG. 1 shows one embodiment of photo-mask A to be used in the first exposure step for the back surface of a substrate; in which (1) is a via hole pattern for forming determined via holes to the back surface of a substrate by the first exposure, and (2) is an alignment mark (a) for forming a base mark on the back surface of a substrate along with formation of via holes to the back surface thereof and it is aligned with an alignment mark (b) as formed in photo-mask B to be used in the second exposure step.

The shape of the pattern of the alignment mark (a) is not specifically defined. For instance, there are mentioned various pattern shapes as shown in FIG. 3, which may clearly indicate the marking position.

Regarding the size of the alignment mark (a), it is necessary that the mark (a) may fall within the range corresponding to the part of forming other various holes, if other determined various holes such as device holes, except via holes, are formed in the subsequent steps.

Figure 2:
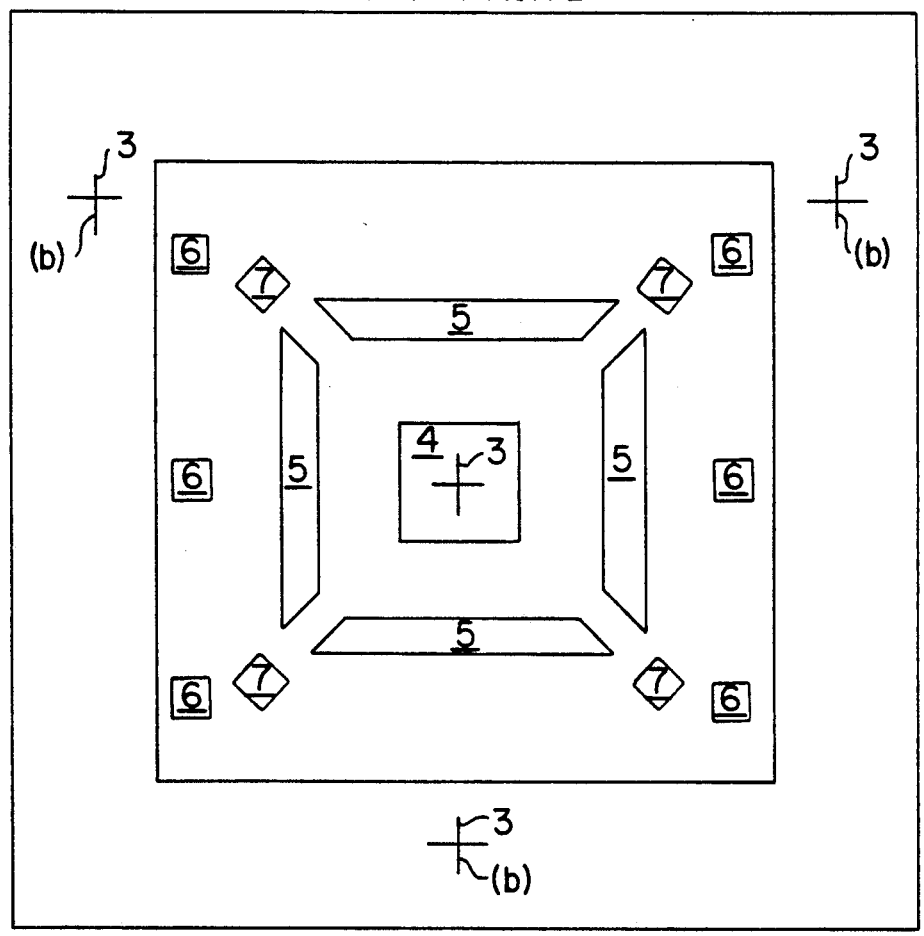
FIG. 2 shows one embodiment of a photo-mask of the present invention for forming device holes, OLB holes, sprocket holes and tooling holes along with a ground metal layer to the back surface of a substrate (hereinafter referred to as photo-mask B).

FIG. 2 shows photo-mask B to be used in the second exposure step; in which (3) is an alignment mark (b) to be provided for the purpose of aligning the via hole pattern (1) as formed on the back surface of a substrate by the first exposure along with alignment marks (a)'s with a pattern of other determined various holes of the photo-mask B, except the via hole pattern (1); and (4), (5), (6) and (7) are various hole patterns for forming device holes, OLB holes, sprocket holes and tooling holes, respectively.

Figure 3:
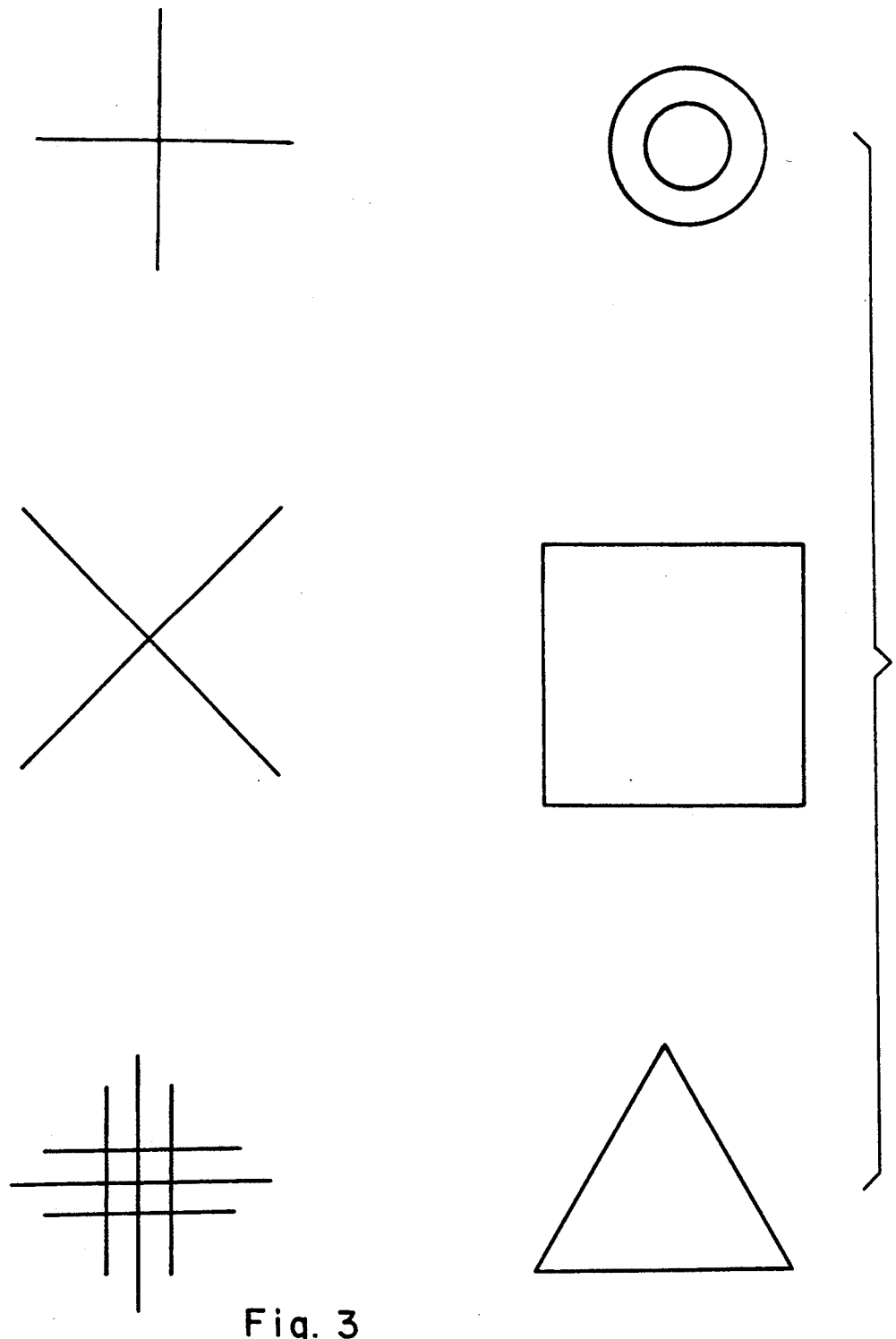
FIG. 3 shows various embodiments of an alignment mark pattern to be formed at the determined positions in the via hole-forming photo-mask A and in the ground metal layer-forming photo-mask B.
Figure 4:
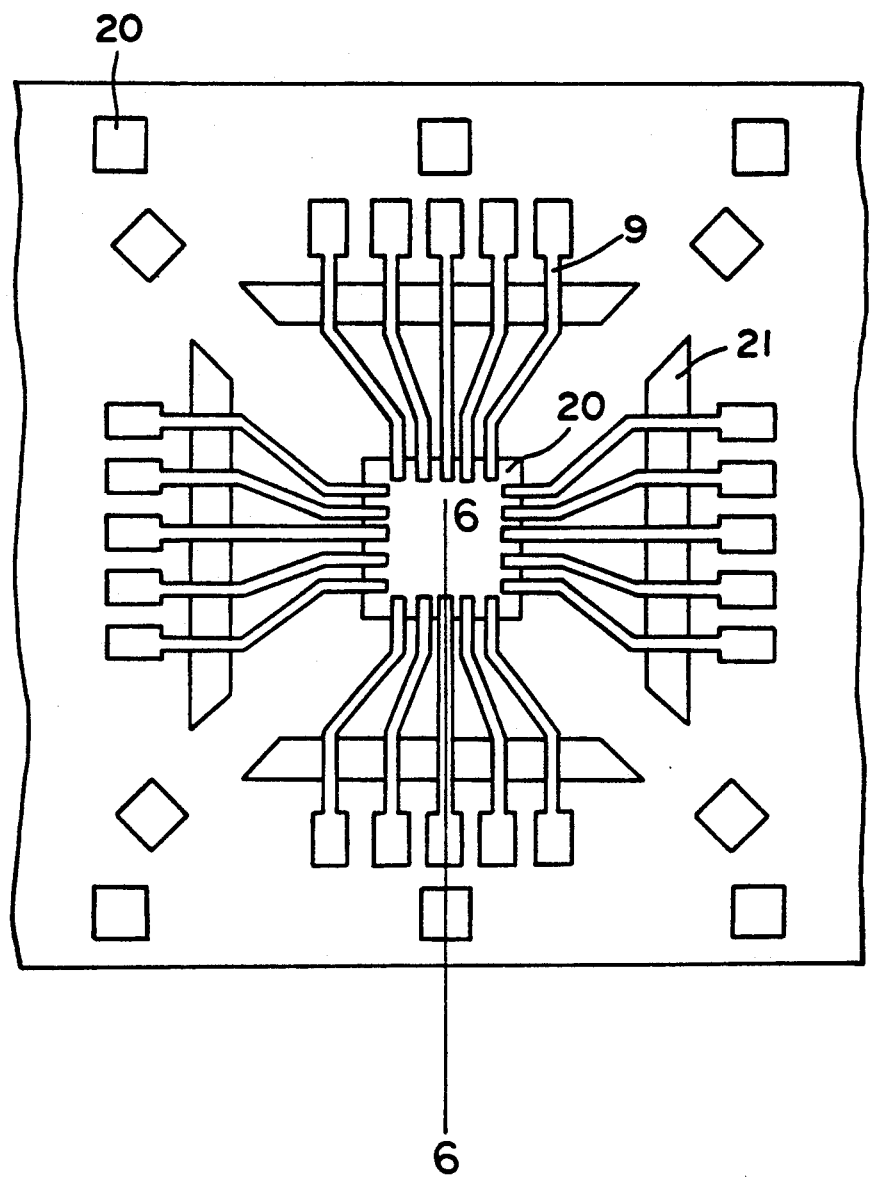
FIG. 4 shows one embodiment of a two-layer TAB as prepared by the use of the two photo-masks A and B of the present invention.

The shape of the alignment mark (b) is not specifically defined, and it may be determined in accordance with the pattern shape of the alignment mark (a) as shown in FIG. 3.

Regarding the size of the alignment mark (b), it is necessary that the mark (b) may fall within the range of the part of forming various determined holes, if the mark (b) is formed in the range of other determined various hole patterns than via holes.

Regarding combination of the alignment marks (a) and the alignment marks (b) to be formed in the photo-mask A and the photo-mask B, respectively, both marks (a) and (b) may be selected in such a way that the alignment mark (b) may easily be aligned in the second exposure with the base mark pattern which has been formed on the back surface of a substrate on the basis of the alignment mark (a) in the first exposure. In forming the alignment mark (a) in the photo-mask A, it is desired that at least one mark (a) is provided in the range corresponding to the part of forming a device hole in the subsequent step for the purpose of accurately aligning the position of the leads to be formed on the top surface of a substrate with the position of the ground layer to be formed on the back surface of the same, whereby the centers of the both patterns are aligned with each other. In addition, it is further preferred that other plural alignment marks (a)'s are provided at other desired positions falling outside the region of forming various hole patterns of OLB holes, sprocket holes and tooling holes, or outside the region of forming TAB patterns. However, where plural TAB patterns are continuously provided in the photo-mask A, alignment marks (a)'s may be provided in the region corresponding to the part of forming device holes of the respective TAB patterns.

The alignment marks (b)'s are provided in the photo-mask B at the positions corresponding to the positions of the alignment marks (a)'s provided in the above-mentioned photo-mask A. For instance, for forming alignment marks (a)'s and alignment marks (b)'s in the photo-mask A and the photo-mask B, respectively, a method may be selected in which other various hole patterns than via holes may most effectively be aligned in the second exposure step with the via hole pattern as formed on the back surface of a substrate by the first exposure step, in accordance with the desired TAB pattern.

Figure 6:
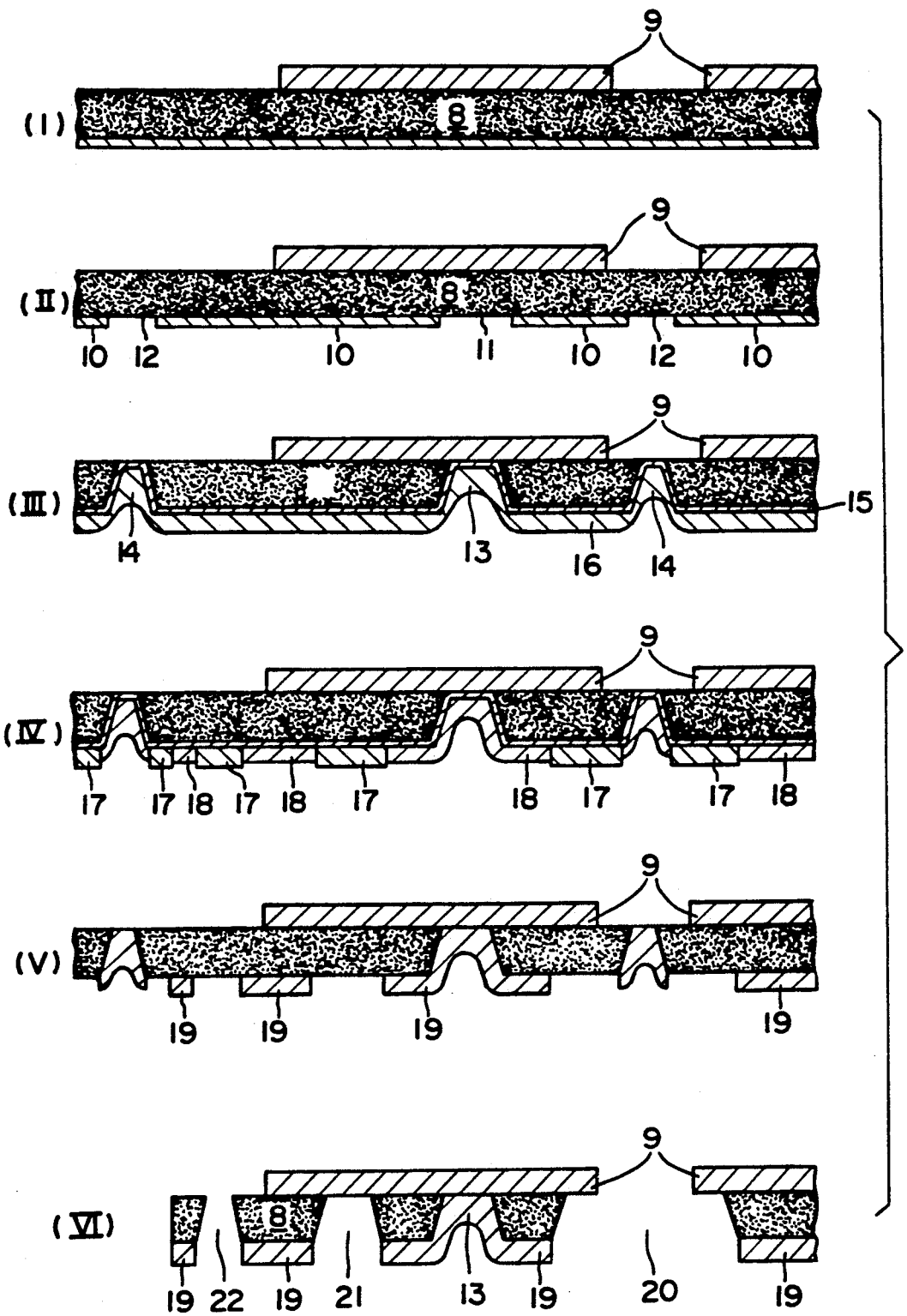
FIG. 6 is an explanatory view of illustrating the order of the steps of forming a two-layer TAB by the use of the photo-masks of the present invention, and it is a cross-sectional view corresponding to the part of 6—6 cross section of FIG. 4.

Next, manufacture of a two-layer TAB from a starting material of a substrate having a metal layer as formed on the top surface thereof, in accordance with the present invention, will be mentioned below, along with the effects of alignment marks (a)'s and alignment marks (b)'s as provided in photo-mask A and photo-mask B, respectively, with reference to FIG. 6 showing an outline of the manufacture scheme.

In FIG. 6, (8) is a film substrate of an insulating resin such as polyimide; (9) is a lead as formed on the top surface of the substrate (8) by a semi-additive method or subtractive method, after resist patterning; (10) is a resist pattern for forming via holes, as formed on the back surface of the substrate (8) by the first exposure; (11) is an exposed part of an insulating resin as exposed by formation of the resist pattern (10); (12) is an exposed part of an insulating resin as formed via an alignment mark (a) provided in the photo-mask A for the purpose of forming, on the back surface of the substrate (8), a base mark for alignment in the second exposure step; (13) is a via hole as formed by dissolving and removing the insulating resin-exposed part (11); and (14) is a base mark as formed by dissolving and removing the insulating resin-exposed part (12).

(15) is a thin metal layer as formed on the back surface of the substrate; and (16) is a resist layer as formed on the thin metal layer (15). (17) is a resist pattern as formed by exposing the resist layer (16) as formed on the back surface of the substrate, via photo-mask B, followed by development of the exposed surface.

(18) is a metal plate layer as formed by electric plating on the thin metal layer (15) as exposed by the resist pattern (17) formed on the back surface of the substrate.

(19) is a ground metal layer as formed by dissolving and removing the thin metal layer existing below the resist pattern (18), after removal of the resist pattern on the back surface of the substrate. (20), (21) and (22) are a device hole, an OLB hole and a sprocket hole, respectively, as formed by dissolving the exposed part of an insulating resin as exposed to the back surface of the substrate by formation of the ground metal layer (19).

Next, an outline of manufacture of a two-layer TAB to which the photo-masks of the present invention are applied will be mentioned below. In manufacture of a two-layer TAB, a metal layer such as a copper layer is formed by coating it on one surface or both surfaces of an insulating resin film such as a polyimide film, without any adhesive, to prepare a substrate. The substrate is used, and a two-layer TAB is manufactured by combination of the following steps (1) to (4):

(1) a step where resist patterns for forming leads and via holes, respectively, are formed on the both surfaces of the substrate;

(2) a step where leads are formed in accordance with the resist pattern as formed on the top surface of the substrate;

(3) a step where via holes are formed in accordance with the resist pattern as formed on the back surface of the substrate; and (4) a step where a ground metal layer is formed on the back surface of the substrate after formation of the via holes.

As means of forming the leads and the ground metal layer in the above-mentioned steps (2) and (4), either a semi-additive method or a subtractive method may be employed.

In the above-mentioned steps, the photo-masks of the present invention are used in formation of various resist patterns to be applied two times to the back surface of the substrate. Precisely, the photo-mask A is used in the step (1) for forming the resist pattern for forming via holes; and the photo-mask B is used in the step (4) for forming the ground metal layer-forming resist pattern.

Next, the effects of the alignment marks to be in the photo-masks of the present invention, which are used in a process of forming a two-layer TAB, will be mentioned below in order.

In carrying out the present invention, a basically tape-shaped insulating resin film substrate, one surface or both surfaces of which has/have been coated with a metal layer without any adhesive as mentioned above, is used as a starting material. For the sake of simple explanation, the case of starting from a so-called single-coated substrate, only the top surface of which has been coated with a metal layer, will be exemplified hereunder.

In the present invention, the insulating resin to be used for forming the insulating resin film substrate (8) includes, for example, polyimide resins, acrylic resins, carbon fluoride resins, polysulfone resins, polyimidamide resins and silicone resins.

Formation of a metal layer on the top surface of the insulating resin film substrate (8) may be effected by a dry metal-coating method such as a sputtering method or a vacuum evaporation deposition method, or by a wet metal-coating method such as a chemical plating method, or by a combination of such methods. As the case may be, these methods may further be combined with an electric plating method. Anyhow, any and every method or combined methods may be employed which may directly form a metal layer on the top surface of the insulating resin film substrate (8) without any adhesive.

As the metal layer to be formed on the insulating resin substrate (8), copper is generally employed. As a matter of course, a thin layer of chromium, nickel or other metal may be between the substrate (8) and copper with no problem.

The thickness of the metal layer to be formed on the top surface of the substrate is not specifically defined. For instance, where formation of leads is effected by a semi-additive method, the thickness of the metal layer may be such that is durable to a soft etching liquid to be applied thereto in the course of pre-treatment for forming an electric metal plate layer prior to formation of leads. Desirably, in view of the condition that the respective leads as formed on the top surface of the substrate are made electrically independent of each other as mentioned hereunder, the metal layer as existing between the leads is better to be dissolved easily. For this, the thickness of the layer is desired to fall within the range of from 0.5 to 2 μm from the viewpoint of the operatability of the dissolution.

Where formation of leads is effected by a subtractive method, the thickness of the metal layer must be the same as the thickness of the desired leads before formation of the resist layer. Accordingly, in the case, it is recommended that the metal layer is formed in such a way that a thin metal layer is first formed on the top surface of the insulating resin substrate (8) by the above-mentioned sputtering method or the like and thereafter the thin layer is grown to have the desired thickness by the successive electric plating. In general, the necessary thickness of leads is up to about 35 μm (refer to FIG. 6(I)).

Next, a resist layer is formed on both the top surface and the back surface of the substrate (8). The thickness of the resist layer to be formed on the top surface must be more than about 35 μm where formation of leads is effected by a semi-additive method, since the thickness of leads is about 35 μm as mentioned above. Where formation of leads is effected by a subtractive method, the thickness of the resist layer is not specifically defined. In view of the pattern accuracy after dissolution of the metal layer, in the case, the thickness is suitably within the range of approximately from 1 to 10 μm.

Regarding the kind of the resist to be used in the present invention, any and every ordinary commercial resist agent can well be used, which is resistant and durable to the plating solution to be used in electric metal plating for formation of leads on the top surface of the substrate or to the metal-dissolving solution to be used in dissolution of the metal layer to be effected thereafter. For instance, usable are negative resists to be prepared by imparting photo-sensitive functional groups to acrylic resins, the light-irradiated part of which remains as a non-dissolved part in development, as well as positive resists to be prepared by imparting photo sensitive functional groups to novolak resins, the light-irradiated part of which dissolves out in development. Both of them can be used in the present invention. Regarding the condition of the resist for use in the present invention, either a liquid resist or a solidified dry film resist may be employed.

As the metal dissolving solution, in general, usable are an acidic solution such as hydrochloric acid, sulfuric acid or nitric acid solution, a metal chloride solution such as iron chloride or copper chloride solution, and a peroxide solution such as ammonium peroxide solution. Therefore, the resist to be used in the present invention may be such that is durable and resistant to these solutions. As the case may be, an alkaline solution may often be used as the metal dissolving solution. In such a case, an alkali-resistant resist may be used.

The resist layer to be formed on the back surface of the substrate resin may be one which is resistant and durable to the dissolving solution for dissolving the resin to be used in the subsequent steps. Where a polyimide resin substrate is used, a rubber resist is desirably employed. This is because the dissolving solution of dissolving the polyimide resin is generally a strong alkaline solution.

Figure 5:
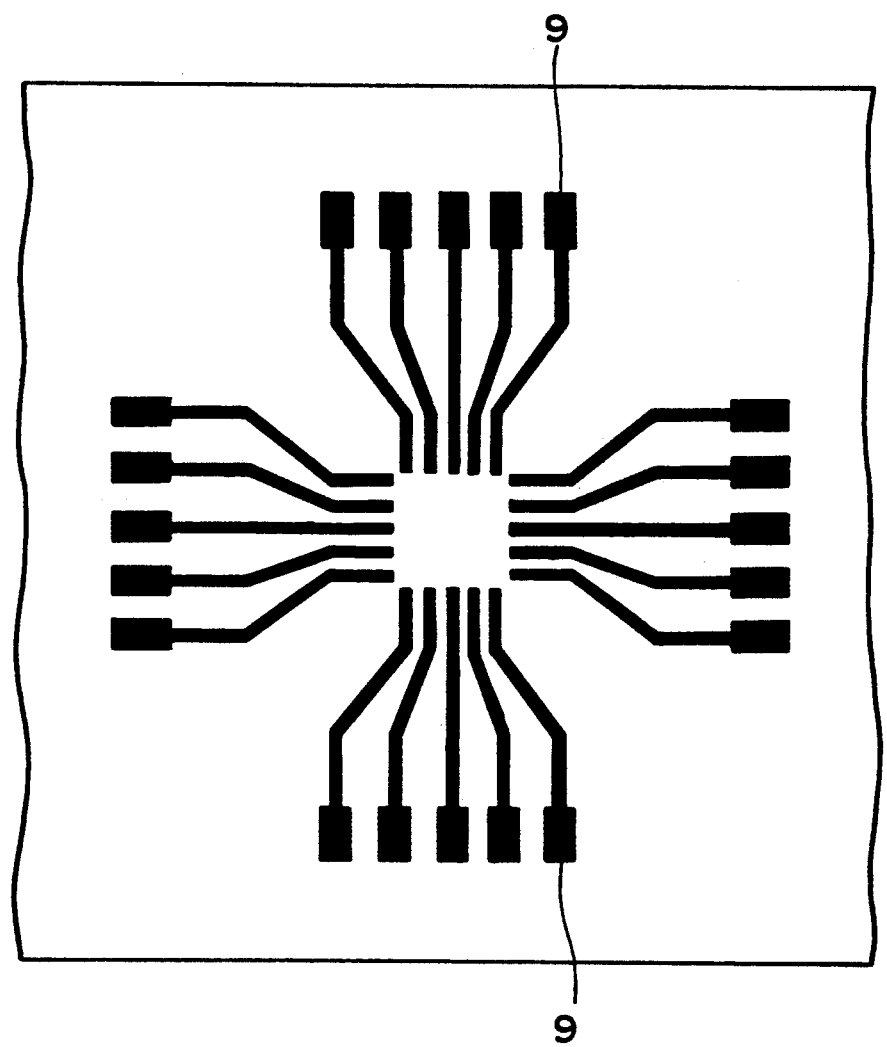
FIG. 5 shows on embodiment of a lead pattern-forming photo-mask to be applied to the top surface of a substrate in manufacture of a two-layer TAB.

Next, a photo-mask having a desired lead pattern, such as that shown in FIG. 5, is applied to the resist layer as formed on the metal layer on the top surface of the substrate, and the substrate is exposed to light through the photo-mask and then developed to form a resist pattern for formation of leads on the metal layer; while a photo-mask A of the present invention, which has a determined via hole pattern and which is provided with alignment marks (a)'s is applied to the resist layer as formed on the resin of the back surface of the substrate, and the substrate is exposed to light through the photo-mask A and then developed to form a resist pattern (10) having a determined via hole pattern. After the operation, the resist pattern (10) where only the resin of the determined parts of forming via holes and only the resin of the determined pattern parts corresponding to the alignment marks (a)'s are exposed therethrough is formed on the back surface of the substrate (refer to FIG. 6(II)).

The photo-mask A as referred to herein and the photo-mask B as will be mentioned hereinafter are one which are made by applying an emulsion of containing silver or the like or a metal such as chromium or the like to a glass or a light-permeable plastic film by firing.

For exposure of the coated substrate, either a contact exposure method where the resist surface and the photo-mask are closely kept in contact to each other during exposure o a projection exposure method where the resist surface and the photo-mask are set in parallel to each other with a certain distance therebetween during exposure may be employed.

For forming leads on the top surface of the substrate, either a conventional semi-additive method or a conventional subtractive method may be employed.

After formation of leads, an organic film (not shown) is covered all over the complete top surface of the substrate. The organic resin film displays a role of protecting the insulating resin to be exposed to the surface by the successive step of partly dissolving the insulating resin. Where a polyimide resin is used as the insulating resin substrate, rubber-type, epoxy-type or silicone-type organic resins can be used for forming the film.

Subsequently, photo-mask A is applied to the back surface of the substrate, which is then exposed and developed thereby to dissolve the exposed parts of the insulating resin as exposed in accordance with the resist pattern formed on the back surface of the substrate to form the determined via holes (13) and the alignment marks (14) (refer to FIG. 6(III)).

Where a polyimide resin is used as the insulating resin layer, dissolution of the resin is effected by the use of a mixed solution comprising a single or mixed solution of a strong alkaline solution such as a hydrazine hydrate or alkali hydroxide and an alcohol such as methyl alcohol, ethyl alcohol or propyl alcohol.

Next, after the resist pattern (10) on the back surface of the substrate has been removed, a thin metal layer (15) is formed wholly on the back surface of the substrate, with metallizing the exposed parts of the insulating resin on the back surface of the substrate, including the side surfaces of via holes (13) and base marks (14), by electroconductive treatment.

For formation of the thin metal layer (15), both of a dry metal-coating method such as a sputtering method or a vacuum evaporation deposition method and a wet metal-coating method such as a chemical plating method may be employed.

In addition, a resist layer (16) is formed on the thin metal layer (15) as formed on the back surface of the substrate. Then, a photo-mask B of the present invention, which has alignment marks (b) and other various determined hole patterns than via holes is applied to the resist layer (16), and the substrate is subjected to the second exposure and development to thereby form the determined resist pattern (17).

In the above-mentioned operation, the base marks (14) as previously formed on the back surface of the substrate are aligned with the alignment marks b) in order that the back surface of the substrate (8) having the resist layer as formed on the thin metal layer (15) is aligned with the photo-mask B. As an order for the alignment, a photo-mask A is first prepared, which has one alignment mark (a) in the center of the TAB pattern to be used and has other plural alignment marks (a) s in other determined plural positions; using the photo-mask A, a base mark (14) is formed by dissolution of the exposed part of the insulating resin on the back surface of the substrate derived from formation of the above-mentioned resist pattern (17); and using the base mark (14) as first formed in the center and the alignment mark (b) as provided in the photo-mask B, the center of the TAB pattern of the substrate B is well aligned with the center of the TAB pattern in the photo-mask B with accuracy. Next, the substrate (8) or the photo-mask B is rotated around the center of the TAB pattern so that the the base marks (14) as provided in other positions are aligned with the positions of the alignment marks (b)'s whereby the base (8) is well aligned with the photo-mask B. As a matter of course, for alignment of the substrate (8) with the photo-mask B, various means may be employed in accordance with the devices to be used and the desired TAB patterns. The above-mentioned method illustrates one example of the means.

An electric metal plate layer (18) is laminated over the exposed portions of the thin metal layer (15) thus resulted from formation of the resist pattern (17) so as to form a metal plate layer on the back surface of the substrate, and thereafter the resist of the resist pattern (10) is removed and the exposed parts of the thin metal layer (15) as existing below it are dissolved and removed to thereby obtain the substrate (8) having a ground metal layer (19) on the back surface thereof (refer to FIG. 6(IV) and FIG. 6(V)).

Where formation of the ground metal layer (19) is effected by a subtractive method, a metal plate layer (18) is first formed on the thin metal layer (15) by electric plating; then a resist layer (16) is formed on the metal plate layer (18); alignment of the base marks (14) as formed on the back surface of the substrate to the alignment marks (b) as provided in the photo-mask B is effected in the same way as that mentioned above; and thereafter the second exposure and development are effected to form a resist pattern (17). Next, the exposed parts of the metal layer (18) as exposed by formation of the resist pattern (17) and the thin metal layer (15) as existing below it are dissolved and removed to thereby form a ground metal layer (19) on the back surface of the substrate.

The resist to be used in the step of forming the ground metal layer (19) may be same as that used in the above-mentioned step of forming via holes. Exposure and development for forming the resist pattern may be effected in accordance with the same procedure as that employed in formation of the above-mentioned resist pattern.

Last, the exposed parts of the insulating resin as exposed to the back surface of the substrate are dissolved to form other various holes than via holes, such as device holes (20), OLB holes (21), sprocket holes (22) and tooling holes. Where an organic resin film has been formed on the top surface of the substrate after formation of leads, the organic resin film is peeled and removed with a suitable resin remover. After all, a two-layer TAB which has determined leads on the top surface of the substrate and has a ground metal layer on the back surface of the same and in which the leads on the top surface are electrically connected with the ground metal layer on the back surface via via holes may surely be obtained with accuracy (refer to FIG. 6(VI)).

Next, the present invention will be explained in more detail by way of the following example, which, however, is not intended to restrict the scope of the present invention.

EXAMPLE

A polyimide resin film substrate (Kapton 200H, manufactured by Toray-DuPont Co.; thickness 50 microns) having a size of 15 cm ×15 cm was dipped in a electroless plating bath having a composition comprising 10 g/liter of copper sulfate, 60 g/liter of EDTA, 6 ml/liter of formalin, 30 mg/liter of dipyridyl and 0.5 g/liter of polyethylene glycol and having a pH value of 12.5, at 70° C. for 10 minutes for forming a electroless copper plate film on the top surface of the substrate. Next, the resulting substrate was then electrolytically copper-plated with an electrolytical copper-plating bath having a composition comprising 100 g/liter of copper sulfate and 180 g/liter of sulfuric acid under the condition of a current density of 2 A/dm$^2$, whereby a subbing copper layer having a thickness of one micron was formed on the top surface of the substrate.

Next, a photo-resist of PMER HC-N600 (negative photo-resist, manufactured by Tokyo Ohka Kogyo Co.) was coated on the subbing copper layer over the top surface of the substrate in a thickness of approximately 40 microns by the use of a bar coater, while a photo-resist of FSR (negative photo-resist, manufactured by Fuji Chemicals Industrial Co.) was coated over the back surface of the substrate in a thickness of approximately 7 microns also by the use of a bar coater. The thus coated two layers were dried at 70° C. for 30 minutes. A glass photo-mask having a TAB pattern (size of 70 mm $\times$ 70 mm; inner lead pitch of 160 microns; inner led width of 80 microns; number of leads of 244) was closely attached to the resist layer as formed on the top surface of the substrate, and ultraviolet rays of 900 mJ/cm$^2$ were applied to the resist layer for exposure via the photo-mask.

On the other hand, a photo-mask, which had 122 via holes corresponding to the TAB pattern as applied to the top surface and which had four alignment marks, was closely attached to the resist layer formed on the back surface of the substrate. Precisely, in the photo-mask as applied to the back surface, the four alignment marks each had a cross shake composed of two rectangles each having a length of 3 mm and a width of 60 microns, and one of them was positioned in the part for forming a device hole at the center of the TAB pattern and the remaining three of them were positioned outside the region of the TAB pattern. The latter three alignment marks were positioned at the same distance from the center of the TAB pattern in such a way that the two lines formed by connecting the center of the respective alignment marks and the center of the TAB mark form an angle of 120 degrees. Then, ultraviolet rays of 100 mJ/cm$^2$ were applied to the back surface of the substrate via the photo-mask for exposure.

Irradiation of the ultraviolet rays was effected by the use of an ultra-high pressure mercury lamp (manufactured by ORC Manufacturing Co.).

Next, the thus irradiated resist layer on the top surface was developed with a developer of PMER (manufactured by Tokyo Ohka Co.) at 25° C. for 7 minutes, then dried at 110° C. for 30 minutes to form a resist pattern having a determined lead pattern.

Subsequently, the exposed copper layer on the top surface of the substrate was electrolytically plated with the above-mentioned electric copper plating bath under the condition of a current density of 2 A/cm$^2$ for a period of 50 minutes to form a copper lead precursor having a thickness of 35 microns thereon.

Next, the resist layer on the back surface was developed with ag developer of FSR-D (manufactured by Fuji Chemicals Industrial Co.) at 25° C. for a period of 50 seconds and then dried at 110° C. for 30 minutes, to thereby form a resist pattern having a determined via hole pattern and a base mark patter with the determined four alignment marks, on the back surface of the substrate.

Subsequently, the resist layer on the top surface was removed by treatment with a 4% sodium hydroxide solution at 50° C. for one minute, and the subbing copper layer on the top surface was treated with an ammoniac alkaline solution having a composition comprising 100 g/liter of copper chloride, 100 g/liter of ammonium chloride, 20 g/liter of ammonium carbonate and 400 ml/liter of aqueous ammonia, at 25° C. for one minute. Accordingly, the respective leads formed were made independent of one another. Next, an organic resin of FSR (manufactured by Fuji Chemicals Industrial Co.) was formed over the whole of the top surface of the substrate in a thickness of approximately 10 microns and dried at 130° C. for 30 minutes to form an organic resin film thereon.

Next, the thus treated substrate was dipped in a mixed solution of ethyl alcohol and 1N potassium hydroxide solution (1/1 by volume) at 50° C. for 4 minutes, whereby the exposed polyimide resin was dissolved to form via holes and base marks on the back surface of the substrate. Then, the remaining resist was removed by treating it with a resin remover of FRS (manufactured by Fuji Chemicals Industrial Co.) at 70° C. for 15 minutes.

Next, using the above-mentioned chemical copper plating solution, a thin copper layer was formed over the whole of the back surface of the substrate, and a photo-resist of PMER HC600 (negative photo-resist, manufactured by Tokyo Ohka Co.) was coated thereover with a bar coater in a thickness of about 20 microns. The thus coated layer was then dried at 70° C. for 30 minutes. To the resist layer was applied a photo-mask corresponding to the TAB pattern as used in the previous exposure step. Precisely, the photo-mask had a pattern of various holes of one device hole having a square shape of 11 mm $\times$ 11 mm, the crossing of the two diagonals of which corresponds to the center of the TAB pattern; four OLB holes each having a trapezoidal shape having an upper side of 22 mm, a lower side of 32 mm and a height of 5 m, and positioned symmetrically to each other via the center of the TAB pattern; 12 sprocket holes (per one side) each having a rectangular shape of 2 mm $\times$ 3 mm, as provided in the both sides of the TAB pattern with the same interval between them; and four tooling holes each having a square shape of 2 mm $\times$ 2 mm, as positioned at the four positions falling within the range of the TAB pattern each on the line formed by connecting the center of the TAB pattern and the respective apexes of the device hole. It additionally had the same four cross-shaped alignment marks as those formed in the via hole pattern-having photo-mask used previously, in the determined positions. Precisely, it had one alignment mark in the device hole and three alignment marks in the region outside the pattern, in the same way as in the via hole pattern-having photo-mask. Then, ultraviolet rays of 400 mJ were irradiated to the substrate via the photo-mask for exposure. The thus exposed substrate was thereafter developed with the above-mentioned developer at 25° C. for 3 minutes and then dried at 110° C. for 30 minutes to form the determined resist pattern.

Next, the substrate was electrolytically plated with the above-mentioned electric copper plating solution under the condition of a current density of 2 A/dm$^2$ for 25 minutes so that a copper ground layer of 18 microns was formed on the exposed thin copper layer on the back surface of the substrate. Then, the remaining resist was removed by treating it with a 4% sodium hydroxide solution at 50° C. for one minute.

Next, the substrate was further treated with a copper chloride solution (200 g/liter) at 50° C. for one minute so that the thin copper layer as still remaining below the resist pattern on the back surface of the substrate was dissolved and removed, whereby the polyimide resin in the parts corresponding to the parts of forming other determined various holes than via holes was exposed. Next, using the above-mentioned polyimide-dissolving solution, the polyimide resin-exposed parts were dissolved to form the determined various holes, and thereafter the organic resin film on the top surface of the substrate was removed by treating it with a resin remover FSR (manufactured by Fuji Chemicals Industrial Co.) at 70° C. for 15 minutes. As a result, a two-layer TAB where the metallic parts of the top surface of the substrate were electrically connected to those of the back surface of the same was obtained with ease, and the position accuracy of the metal patterns on the both surfaces of the substrate was extremely good in the two-layer TAB thus formed.

Photo-masks of the present invention are extremely effectively used in manufacture of a two-layered TAB in the step of exposure and development of the back surface of the substrate. Specifically, in manufacture of a two-layer TAB having a ground metal layer on the back surface of the substrate and having leads on the top surface of the same, the leads being electrically connected with the ground metal layer via via holes, the photo-masks of the present invention are advantageously used in the two exposure steps to be applied to the back surface of the substrate so as to well accurately align the relative positions of the substrate and the respective photo-masks. Accordingly, a two-layer TAB with high-level quality and characteristics can surely and easily be manufactured by the use of the photo-masks of the present invention.

While the invention has been described in detail and with reference to specific embodiments thereof, it will be apparent to one skilled in the art that various changes and modifications can be made therein without departing from the spirit and scope thereof.

What is claimed is:

1. A combination of first and second photomasks for use in two exposure steps when forming a ground metal layer on the back surface of a substrate in the manufacture of a two-layer TAB in which a metal layer is formed on one surface or both surfaces of an insulating resin substrate without an adhesive, determined metal leads are formed on the top surfaces of the substrate, via holes are formed on the determined positions of the substrate, a ground metal layer is formed on the back surface of the substrate, and a part of the leads formed on the top surface of the substrate are electrically connected with the ground metal layer formed on the back surface of the same via the via holes; the first photomask used in the first exposure step for forming the via holes to the back surface of the substrate including means providing a plurality of alignment marks in the determined plural positions thereof and the second photomask used in the second exposure step for forming the ground metal layer on the back surface of the substrate including means providing a plurality of alignment marks in corresponding positions to the alignment marks in the first photomask.

2. A combination of photomasks as claimed in claim 1, in which at least one of the plurality of alignment marks in the first photomask is at a position corresponding to where a device hole, and OLB hole, a sprocket hole or a tooling hole is to be holed in the substrate.

* * * * *